(12) United States Patent
Heiling et al.

(10) Patent No.: US 7,687,912 B2
(45) Date of Patent: Mar. 30, 2010

(54) SEMICONDUCTOR COMPONENT COMPRISING INTERCONNECTED CELL STRIPS

(75) Inventors: Christian Heiling, Soeding (AT); Clemens Kain, Kammern (AT); Valentin Cee, Graz (AT)

(73) Assignee: Infineon Technologies AG, Munich (DE)

( * ) Notice: Subject to any disclaimer, the term of this patent is extended or adjusted under 35 U.S.C. 154(b) by 599 days.

(21) Appl. No.: 11/541,428

(22) Filed: Sep. 29, 2006

(65) Prior Publication Data

US 2007/0108617 A1 May 17, 2007

(30) Foreign Application Priority Data

Sep. 30, 2005 (DE) ................ 10 2005 047 104

(51) Int. Cl.
*H01L 23/48* (2006.01)
*H01L 23/52* (2006.01)
*H01L 29/40* (2006.01)

(52) U.S. Cl. .................... 257/758; 257/E23.015
(58) Field of Classification Search ................ 257/758, 257/E23.015
See application file for complete search history.

(56) References Cited

U.S. PATENT DOCUMENTS

| | | | | |
|---|---|---|---|---|
| H842 H | * | 11/1990 | Ochs ................ | 257/767 |
| 5,258,638 A | * | 11/1993 | Elhatem et al. ........... | 257/401 |
| 5,625,207 A | * | 4/1997 | Trolle et al. ............... | 257/207 |
| 5,672,894 A | | 9/1997 | Maeda et al. | |
| 5,682,048 A | | 10/1997 | Shinohara et al. | |
| 5,767,546 A | * | 6/1998 | Williams et al. .......... | 257/343 |
| 6,274,896 B1 | * | 8/2001 | Gibson et al. ............. | 257/259 |
| 2003/0030087 A1 | * | 2/2003 | Ooi .......................... | 257/296 |
| 2004/0184331 A1 | * | 9/2004 | Hanzawa et al. .......... | 365/203 |
| 2005/0128843 A1 | * | 6/2005 | Kajimoto et al. ......... | 365/205 |
| 2008/0169462 A1 | * | 7/2008 | Nakamura et al. ........ | 257/40 |

FOREIGN PATENT DOCUMENTS

EP           0 720 225 A2    12/1995

* cited by examiner

*Primary Examiner*—Kiesha R. Bryant
*Assistant Examiner*—Igwe U Anya
(74) *Attorney, Agent, or Firm*—Maginot, Moore & Beck

(57) ABSTRACT

A semiconductor component comprises a semiconductor body including a front side and a number of cell strips. Each of the cell strips includes a terminal zone of a first type arranged on the front side of the semiconductor body and a terminal zone of a second type arranged on the front side of the semiconductor body. A patterned first metallization layer, a patterned second metallization layer, and a patterned third metallization layer are arranged successively on the front side. A first plurality of conductive lines are formed in the first metallization layer and a second plurality of conductive lines are formed in the second metallization layer. The second plurality of conductive lines cross the first plurality of conductive lines at crossover locations. The second plurality of conductive lines are electrically conductively connected to the first plurality of conductive lines at predetermined crossover locations.

14 Claims, 8 Drawing Sheets

SEMICONDUCTOR COMPONENT COMPRISING INTERCONNECTED CELL STRIPS

CROSS-REFERENCE TO RELATED APPLICATIONS

This document claims priority from German patent application number 10 2005 047 104.8, filed on Sep. 30, 2005.

FIELD

The invention relates to a semiconductor component, in particular a power semiconductor component comprising interconnected cell strips.

BACKGROUND

In order to be able to carry higher currents, semiconductor components of this type have a plurality of cells that are electrically connected in parallel with one another. Each of the cells comprises a terminal zone of a first type, for example, a drain terminal of a DMOS cell, and a terminal zone of a second type, for example a source terminal of a DMOS cell. Usually a plurality of such cells are in each case connected together to form cell strips.

In order that two or more of such cell strips are electrically connected in parallel, with regard to all the cell strips to be connected in parallel firstly their terminal zones of the first type must be electrically conductively connected to one another and secondly their terminal zones of the second type must be electrically conductively connected to one another.

FIG. 1 shows a section of such a semiconductor component in accordance with the prior art in a perspective view.

The semiconductor component comprises a semiconductor body 10 having two cell strips 91, 92 having a cell strip width d ("pitch"), which each have a strip-shaped terminal zone 7 of a first type and a strip-shaped terminal zone 8 of a second type. The terminal zones 7, 8 run in a first lateral direction x of the semiconductor body 10 and perpendicular to a second lateral direction y of the semiconductor body 10.

By way of example, the terminal zones 7 of the first type are formed as drain terminal zones D and the terminal zones 8 of the second type are formed as source terminal zones S. The terminal zones 7 of the first type and terminal zones 8 of the second type are arranged alternately successively and parallel to one another.

A patterned first metallization layer 1, a patterned second metallization layer 2 and a patterned third metallization layer 3 are arranged successively on the front side 19 of the semiconductor body 10 above the terminal zones 7, 8. The first and second metallization layers 1, 2 are formed from aluminum and the third metallization layer 3 is formed from copper.

The third metallization layer 3 has a first section 33 and a second section 34. All the terminal zones 7 of the first type are electrically conductively connected to the first section 33 and all the terminal zones 8 of the second type are electrically conductively connected to the second section 34 of the third metallization layer 3.

The first and second metallization layers 1, 2 are primarily required for feeding the necessary electrical drive signals to terminal zones (not illustrated in FIG. 1) for driving the cell strips 91, 92 that is to say the gate terminal zones thereof, by way of example.

Since, for this reason, the first and the second metallization layer 1, 2 cannot be dispensed with, sections of the first and the second metallization layer 1, 2 are used for producing, together with plated-through holes 41, 51, 61 which are also referred to as "vias", and also with further plated-through holes that are not discernible in this view, the electrically conductive connections between the terminal zones 7 of the first type and the first section 33 of the third metallization layer 3 and also between the terminal zones 8 of the second type and the second section 34 of the third metallization layer 3.

For this purpose, the patterned first metallization layer 1 has conductive lines 11, 12, 13, 14 spaced apart from one another and the patterned second metallization layer 2 has conductive lines 21, 22, 23, 24 spaced apart from one another. The conductive lines 11, 12, 13, 14, 21, 22, 23, 24 are formed in strip-shaped fashion and run parallel to one another and also parallel to the strip-shaped terminal zones 7, 8 of the semiconductor body 10.

Each of the terminal zones 7, 8 forms a unit with two overlaying conductive lines, of which one belongs to the first metallization layer 1 and one belongs to the second metallization layer 2, and is electrically conductively connected to these by means of plated-through holes. Arranged above the conductive lines 21, 23 of the second metallization layer 2 are plated-through holes 61 which electrically connect the conductive lines 21, 23 to the first section 33 of the third metallization layer 3.

Correspondingly, arranged above the conductive lines 22, 24 of the second metallization layer 2 are plated-through holes (not discernible in FIG. 1) which electrically connect the conductive lines 22, 24 to the second section 34 of the third metallization layer 3.

An intermetal dielectric is generally arranged between the semiconductor body 10 and the first metallization layer 1, between the first metallization layer 1 and the second metallization layer 2, between the second metallization layer 2 and the third metallization layer 3, between the conductive lines 11, 12, 13, 14 of the first metallization layer 1, between the conductive lines 21, 22, 23, 24 of the second metallization layer 2, and also between the sections 33, 34 of the third metallization layer 3; the illustration of said intermetal dielectric has been dispensed with in FIG. 1 for reasons of clarity.

FIG. 2 shows a plan view of the semiconductor component in accordance with FIG. 1. This view reveals the conductive lines 21, 22, 23 and 24 of the second metallization layer, above which the sections 33, 34 of the third metallization layer are arranged.

The positions of plated-through holes 61, 62 arranged between the second and the third metallization layer 2, 3 are indicated as dotted circles in FIG. 2.

In this case, the plated-through holes 61 connect the conductive lines 21, 23 of a second metallization layer that are connected to the drain terminal zones to the first section 33 of the third metallization layer. The plated-through holes 62 correspondingly connect the conductive lines 22, 24 of the second metallization layer that are connected to the source terminal zones to the second section 34 of the third metallization layer.

In the context of technical further development, the cell strip widths d decrease further and further whilst retaining the same current-carrying capacity, which, relative to the active chip area, leads to ever higher current densities in the component.

In such an arrangement with increasing current densities undesirably high voltages are dropped across the electrical line resistances between the terminal zones 7 and the section 33 of the third metallization layer 3 and also between the terminal zones 8 and the section 34 of the third metallization layer 3.

SUMMARY

The semiconductor component according to at least one embodiment of the invention comprises a semiconductor body having a front side, in which a number of cell strips formed from DMOS cells for example, are arranged.

Each of the DMOS cell strips comprises a terminal zone of a first type, for example a drain terminal zone and a terminal zone of a second type, for example a source terminal zone. The terminal zones of the first type and the terminal zones of the second type are arranged on a front side of the semiconductor body.

In order to connect the cell strips in parallel, the terminal zones of the first type are electrically conductively connected to one another. Furthermore, the terminal zones of the second type are electrically conductively connected to one another.

For this purpose, a patterned first metallization layer, a patterned second metallization layer and a patterned third metallization layer are arranged successively on the front side, conductive lines being formed in each case in the first metallization layer and in the second metallization layer.

Conductive lines of the second metallization layer cross conductive lines of the first metallization layer at crossover locations and are electrically conductively connected at predetermined crossover locations to the crossed conductive lines of the first metallization layer for example by means of a plated-through hole ("via").

On account of such an arrangement, the conductive lines of the first metallization layer and the conductive lines of the second metallization layer form together with the plated-through holes situated between them, a reticulated structure through which, unlike in the case of a semiconductor component in accordance with the prior art, a current flow is possible in two lateral directions of the semiconductor body, rather than only in one. The electrical resistance of the component is thus reduced as a result.

The above described features and advantages, as well as others, will become more readily apparent to those of ordinary skill in the art by reference to the following detailed description and accompanying drawings.

BRIEF DESCRIPTION OF THE DRAWINGS

Embodiments of the invention are explained in more detail below with reference to figures, in which.

DESCRIPTION

In the figures—unless specified otherwise—identical reference symbols designate identical elements with the same meaning.

Figure 1:
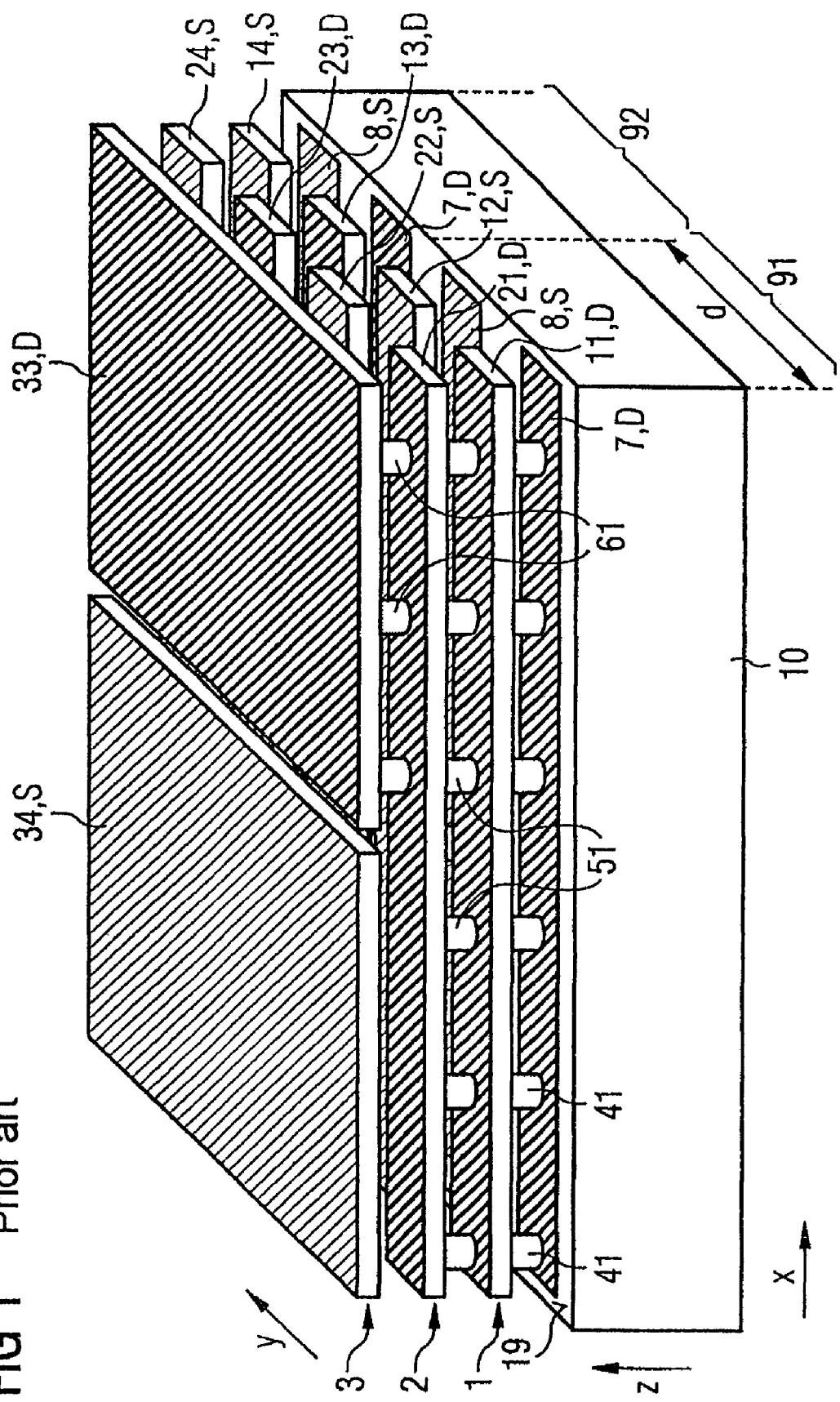
FIG. 1 shows a perspective view of a section of the active zone of a semiconductor component in accordance with the prior art.
Figure 2:
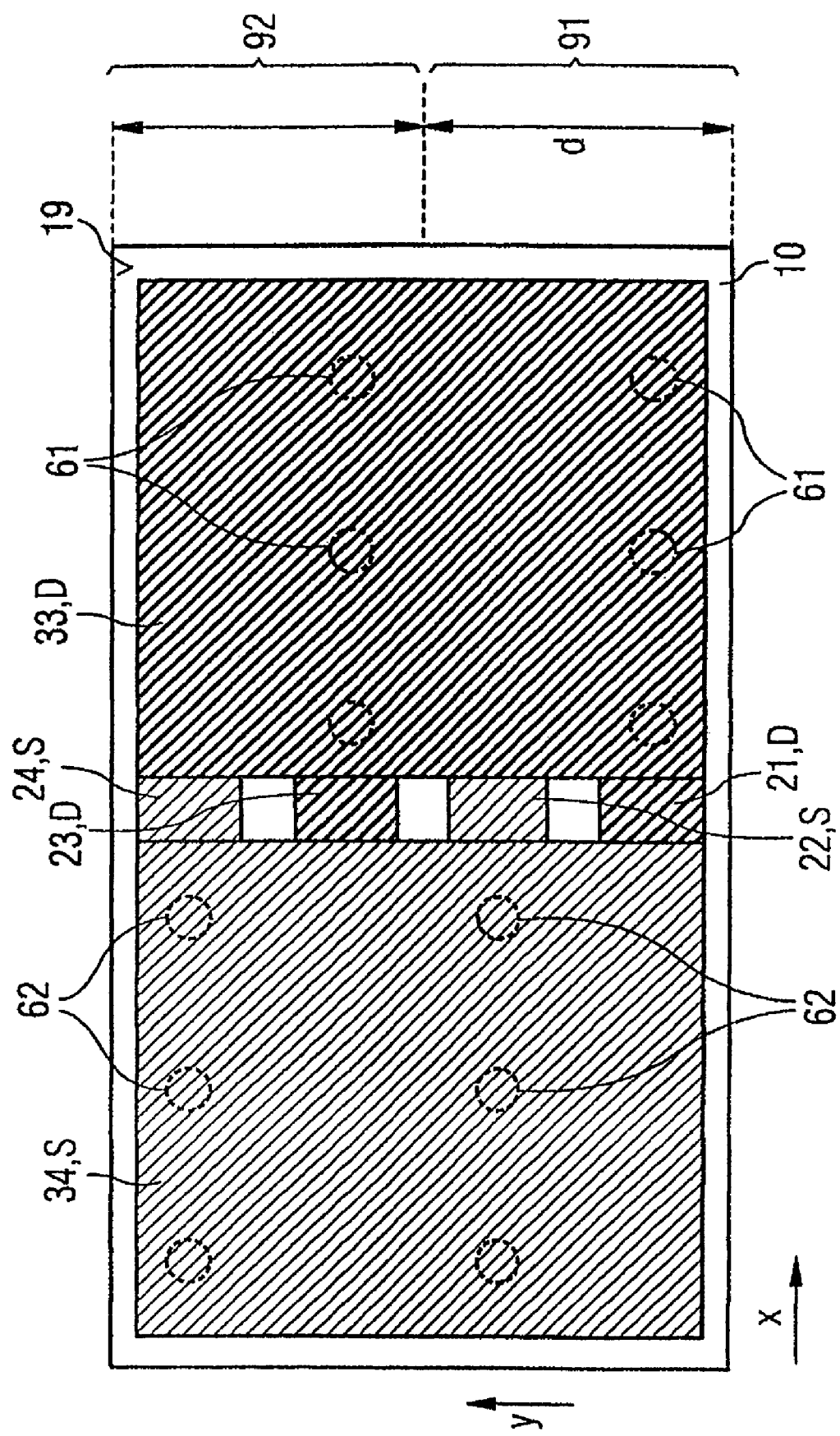
FIG. 2 shows a plan view of the semiconductor component in accordance with FIG. 1.
Figure 3:
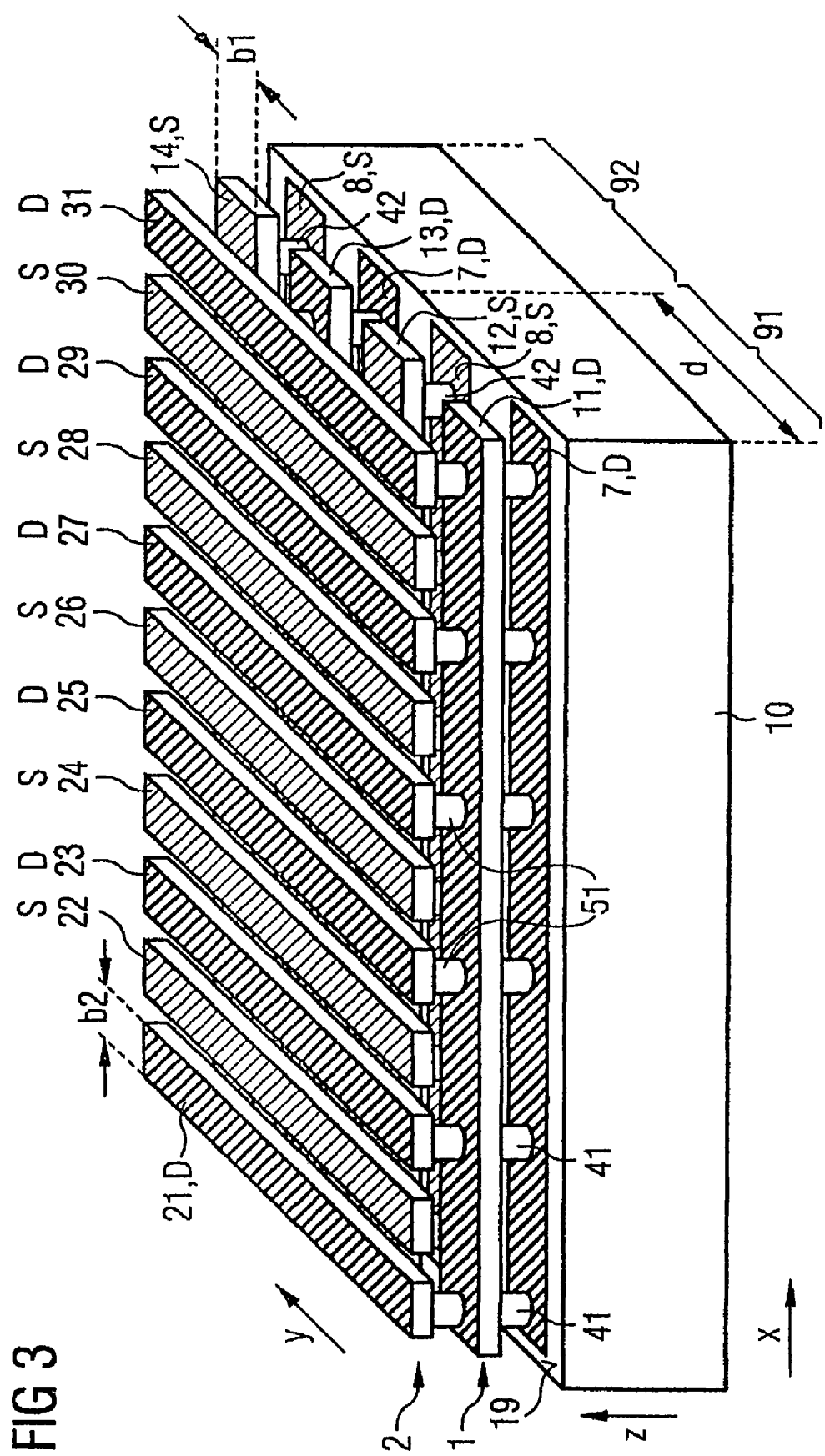
FIG. 3 shows a perspective view of a section of the active zone of a semiconductor component with the third metallization layer removed.

FIG. 3 shows a perspective view of a section from the region of the active zone of a semiconductor component according to at least one embodiment of the invention.

The semiconductor component has a semiconductor body 10 extending in a first lateral direction x and in a second lateral direction y.

The semiconductor body 10 comprises DMOS cell strips 91, 92 having a cell strip width d each having a drain terminal zone 7 and a source terminal zone 8. The terminal zones 7 and 8 are arranged in a manner spaced apart from one another on a front side 19 of the semiconductor body 10, said front side being parallel to the x-y plane, are formed in elongate fashion and run in the first lateral direction x. The drain terminal zones 7 and the source terminal zones 8 are furthermore arranged alternately successively in the second lateral direction y.

A first metallization layer 1, a second metallization layer 2 and also a third metallization layer—not illustrated in this view for reasons of clarity—are arranged successively on the front side 19 of the semiconductor body 10.

The first and the second metallization layer 1, 2 are preferably formed from aluminum or an aluminum alloy, while the third metallization layer preferably comprises copper or a copper alloy.

The first metallization layer 1 comprises a multiplicity of conductive lines 11, 12, 13, 14 having a width b1, which are formed in elongate fashion and run in the first lateral direction x and which are preferably spaced apart from one another at least above the active zone of the semiconductor component.

The second metallization layer 2 correspondingly has a multiplicity of conductive lines 21, 22, 23, 24, 25, 26, 27, 28, 29, 30, 31 having a width b2 which are formed in elongate fashion and run in the second lateral direction y and are preferably spaced apart from one another at least above the active zone.

The conductive lines 11, 13 of the first metallization layer 1 and the conductive lines 21, 23, 25, 27, 29, 31 of the second metallization layer 2 are electrically conductively connected to the drain terminal zones 7.

The conductive lines 12, 14 of the first metallization layer 1 and the conductive lines 22, 24, 26, 28, 30 of the second metallization layer 2 are correspondingly electrically conductively connected to the source terminal zones 8.

Within each of the metallization layers 1, 2 the conductive lines 11, 13 and 21, 23, 25, 27, 29, 31 connected to the drain terminals 7 and the conductive lines 12, 14 and 22, 24, 26, 28, 30 connected to the source terminals 8 are arranged alternately successively.

The conductive lines 11 to 12, 21 to 31 are identified by letters "D" or "S", depending on whether the relevant conductive line is electrically conductively connected to the drain terminal zones 7 ("D") or to the source terminal zones 8 ("S").

For producing the electrically conductive connections between the terminal zones 7, 8 and the conductive lines 11 to 14 and 21 to 31, plated-through holes are provided, of which only plated-through holes 41, 42 and 51 are discernible in the present view.

The plated-through holes 41 are arranged above the drain terminal zones 7 between the front side 19 and the first metallization layer 1 and connect the drain terminal zones 7 to the conductive lines 11, 13 of the first metallization layer 1.

Furthermore, the plated-through holes 42 are arranged above the source terminal zones 8 between the front side 19 and the first metallization layer 1 and connect the source terminal zones 8 to the conductive lines 12, 14, of the first metallization layer 1.

The plated-through holes 51 are arranged between the first and the second metallization layer 1, 2 at crossover locations at which the conductive lines 21, 23, 25, 27, 29, 31 of the second metallization layer 2 cross the conductive lines 11, 13 of the first metallization layer 1, and, at said crossover locations, connect the conductive lines 11, 13 of the first metallization layer 1 to the conductive lines 21, 23, 25, 27, 29, 31 of the second metallization layer 2.

In a corresponding manner, plated-through holes—not discernible in the present view—are arranged between the first and the second metallization layer 1, 2 at crossover locations at which the conductive lines 22, 24, 26, 28, 30 of the second metallization layer 2 cross the conductive lines 12, 14 of the first metallization layer 1, and, at said crossover locations connect the conductive lines 12, 14 of the first metallization layer 1 to the conductive lines 22, 24, 26, 28, 30 of the second metallization layer 2.

Figure 4:
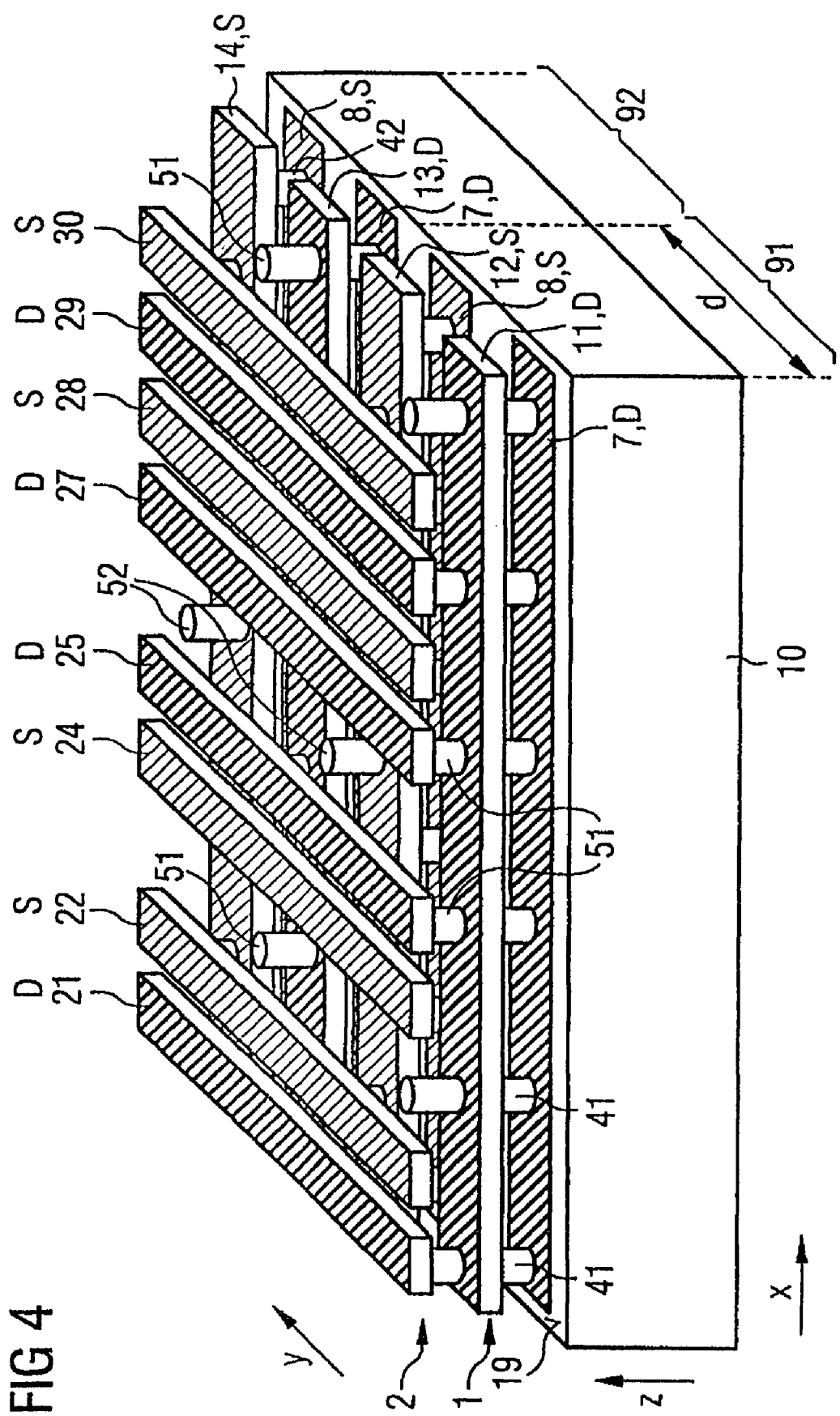
FIG. 4 shows a view of the semiconductor component in accordance with FIG. 3, in which some of the conductive lines of the second metallization layer have been removed.

FIG. 4 shows the arrangement in accordance with FIG. 3, the conductive lines 23, 26 and 31 having been removed, as a result of which plated-through holes 52 are discernible, which are arranged between the conductive lines 12, 14 of the first metallization layer 1 and the conductive lines 22, 24, 26, 28 and 30 of the second metallization layer 2 and electrically conductively connect the conductive lines 22, 24, 26, 28, 30 to the conductive lines 12, 14 at crossover locations.

Figure 5:
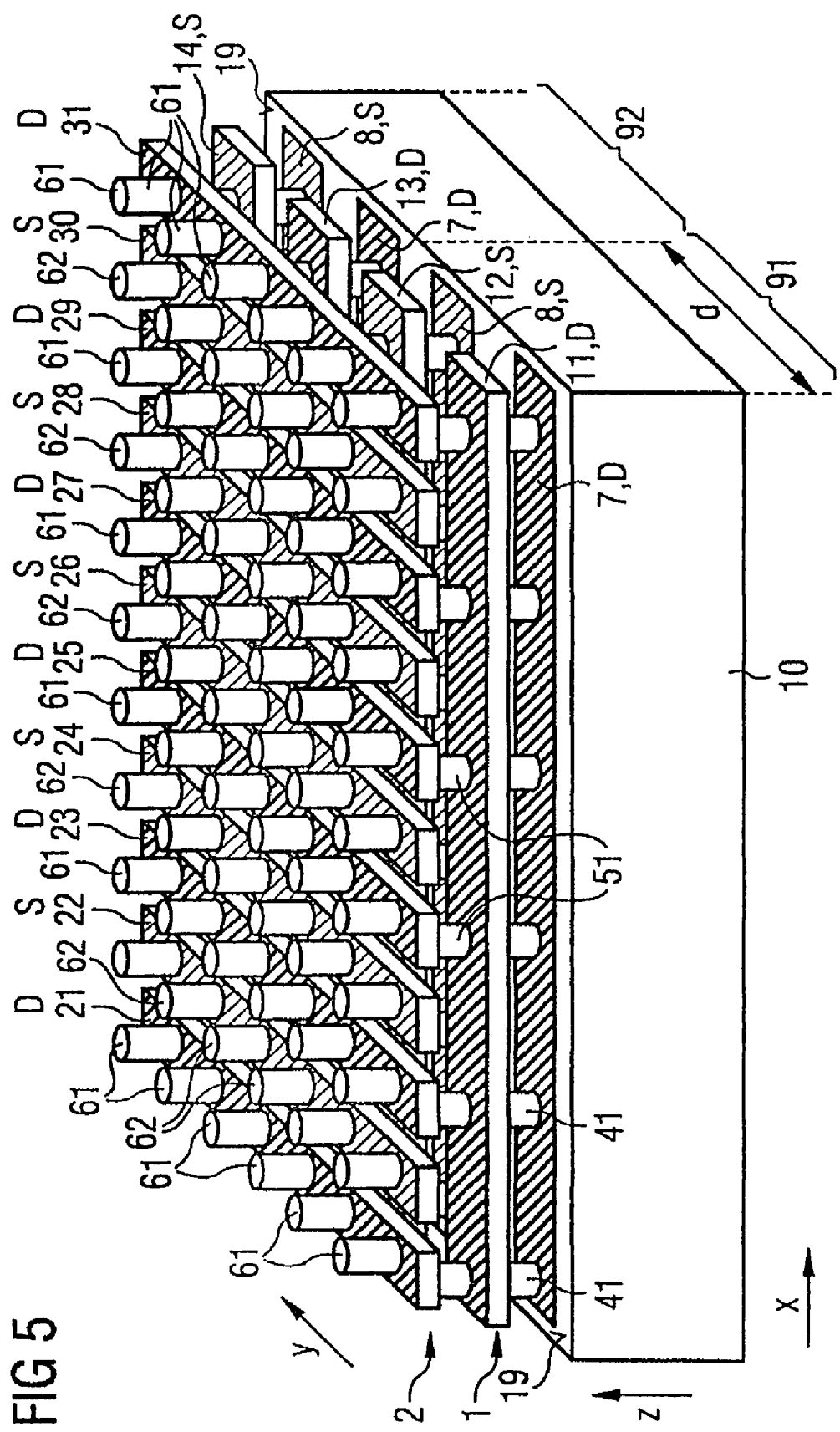
FIG. 5 shows a view of the semiconductor component in accordance with FIG. 3, with plated-through holes arranged on the second metallization layer.

FIG. 5 shows the arrangement in accordance with FIG. 3 in which plated-through holes 61, 62 are arranged on the conductive lines 21 to 31 of the second metallization layer 2, and serve for connecting the conductive lines 21 to 31 to sections (not illustrated) of the third metallization layer. In this case, the plated-through holes 61 are arranged on the conductive lines 21, 23, 25, 27, 29, 31 connected to the drain terminal zones 7 and the plated-through holes 62 are arranged on the conductive lines 22, 24, 26, 28, 30 connected to the source terminal zones 8.

Figure 6:
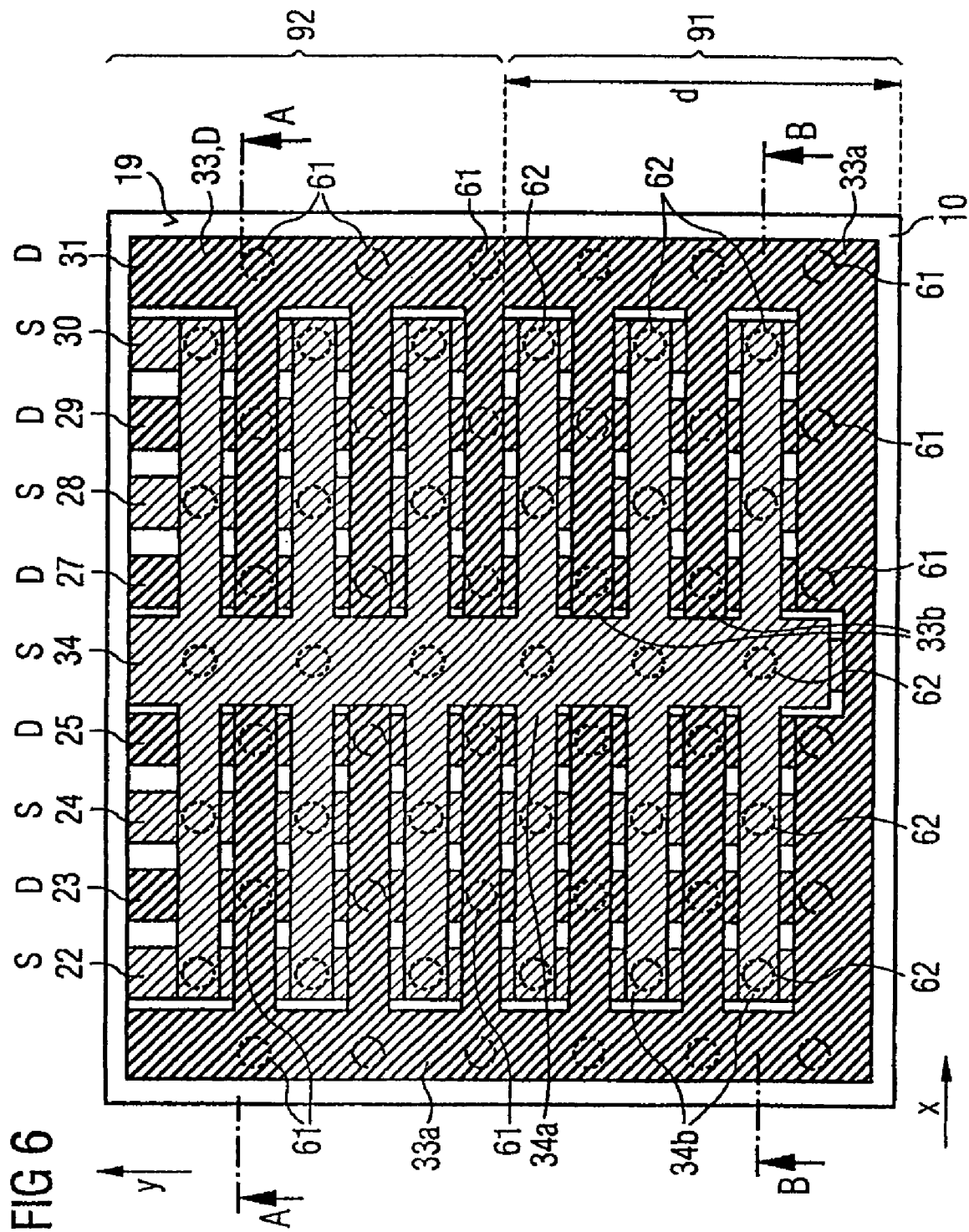
FIG. 6 shows a plan view of the third metallization layer—having two sections—of the semiconductor component in accordance with FIG. 3, each of the sections having extensions which are arranged parallel to one another and intermesh with the extensions of the other section.

FIG. 6 shows a plan view of the arrangement in accordance with FIG. 5, which, however, additionally illustrates sections 33, 34 of the third metallization layer above the second metallization layer 2 and above the plated-through holes 61, 62.

The section 33 of the third metallization layer is connected to the conductive lines 21, 23, 25, 27, 29, 31 of the second metallization layer 2 by means of the plated-through holes 61, the position of which is indicated by dashed lines.

Furthermore, the section 34 of the third metallization layer is connected to the conductive lines 22, 24, 26, 28, 30 of the second metallization layer 2 by means of the plated-through holes 62, the position of which is likewise indicated by dashed lines.

In order to minimize the electrical resistance of the wiring formed from the conductive lines of the metallization layers and the plated-through holes, the sections 33 are provided with extensions 33b running parallel to one another and the sections 34 are provided with extensions 34b running parallel to one another, with the result that comblike structures arise.

The extensions 33b of the first section 33 and the extensions 34b of the second section 34 intermesh in one another.

The extensions 33b of the section 33 run in the first lateral direction x and are electrically connected to one another by means of partial sections 33a of the section 33 which run in the second lateral direction y.

The extensions 34b of the section 34 also run in the first lateral direction x. They are electrically connected to one another by means of partial sections 34a of the section 34 which run in the second lateral direction y.

Since the electric currents flowing through the extensions 33b and 34b combine in the partial sections 33a and 34a, respectively, the width of the partial sections 33a and 34a is preferably chosen to be greater than the width of the extensions 33b and 34b, respectively.

With a suitable arrangement of the extensions 33b and 34b, said extensions may cross a plurality of the conductive lines 21 to 31 of the second metallization layer 2 and be electrically connected to one another at predetermined crossover locations by means of the plated-through holes 61 and 62, respectively.

This results in an arrangement having a multiplicity of crossover and connection locations at which the first metallization layer is electrically connected to the second metallization layer and the second metallization layer is electrically connected to the third metallization layer. This multiplicity of connections gives rise to a reticulated structure so that a current between a specific location of a terminal zone and a specific location of that section of the third metallization layer which is connected to said terminal zone can be effected via a path which is generally shorter and has a lower resistance than the corresponding current path in an otherwise equivalent semiconductor component in accordance with the prior art.

A reticulated structure formed from the first, second and third metallization layers and the plated-through holes is thus responsible for the resistance-reducing property of the wiring.

What is crucial primarily is to realize, by means of the plated-through holes, a largest possible number of connection locations which are to be distributed as homogeneously as possible between the various metallization layers and terminal zones and also as homogeneously as possible between the conductive lines and sections of the three metallization layers that are connected to the terminal zones of the first type and of the second type.

In accordance with at least one suitable embodiment of the invention, an optimum current distribution and a lowest possible electrical resistance of the wiring can be achieved when double to quadruple, particularly preferably, triple, the width d of the cell strips 91, 92 is chosen for the width b1 of the conductive lines 11, 12, 13, 14, of the first metallization layer 1 and/or the width b2 (see FIG. 3) of the conductive lines 21 to 31 of the second metallization layer 2.

In the present exemplary embodiment, the conductive lines 11, 12, 13, 14 of the first metallization layer 1 and the conductive lines 21 to 31 of the second metallization layer 2 run perpendicular to one another. In principle, however, the conductive lines 11, 12, 13, 14 of the first metallization layer 1 may form with the conductive lines 21 to 31 of the second metallization layer 2 an arbitrary angle different from 0° and from 180°, preferably an angle of 90°, or alternatively an angle of more than 0° and less than 90°. The only crucial factor is obtaining as many crossover locations as possible at which conductive lines of the second metallization layer 2 cross conductive lines of the first metallization layer 1, conductive lines 21 to 31 of the second metallization layer 2, if possible, advantageously crossing at least two conductive lines of the first metallization layer 1 and being connected to these crossed conductive lines.

Figure 7:
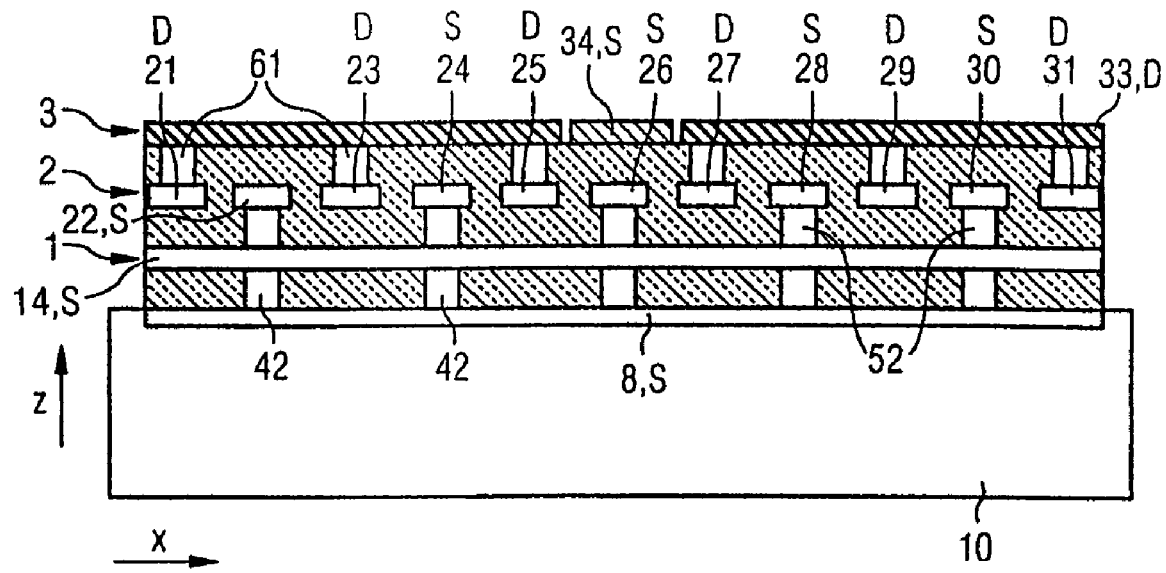
FIG. 7 shows a vertical section through the semiconductor component in accordance with FIG. 6, in a plane A shown in FIG. 6.

FIG. 7 shows a vertical section through the semiconductor component in accordance with FIG. 6 in a sectional plane A illustrated in FIG. 6.

Figure 8:
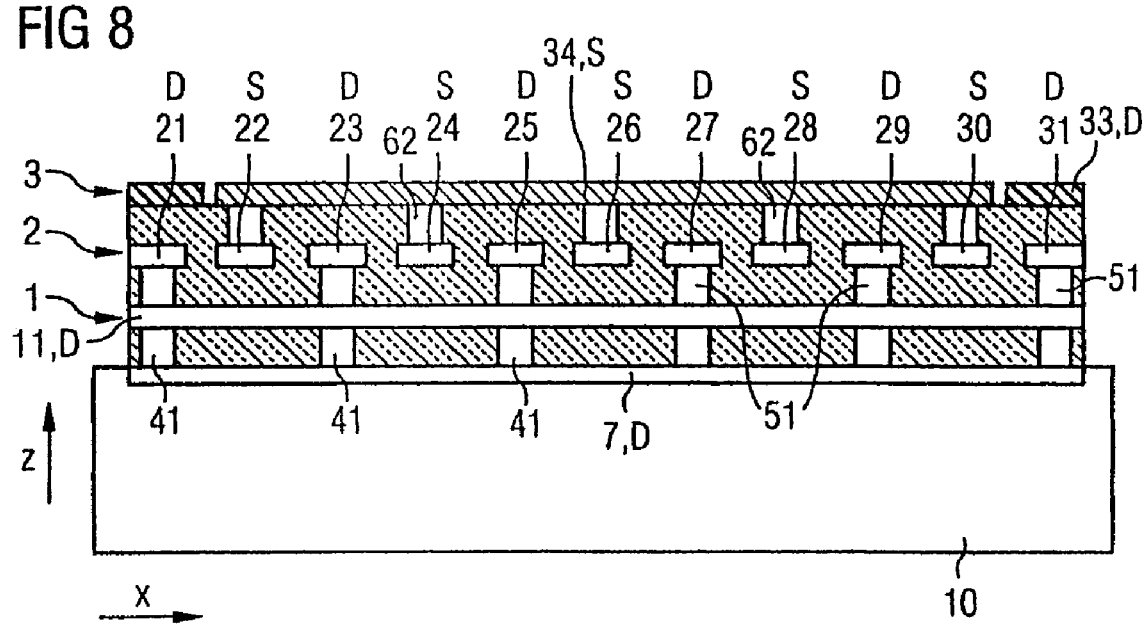
FIG. 8 shows a vertical section through the semiconductor component in accordance with FIG. 6, in a plane B shown in FIG. 6.

FIG. 8 shows a vertical section through the semiconductor component in accordance with FIG. 6 in a sectional plane B illustrated in FIG. 6.

FIGS. 7 and 8 show the source terminal zones 7 and the drain terminal zones 8, which are formed as doped zones in the semiconductor body 10 and extend as far as the front side 19 thereof.

The first metallization layer 1, the second metallization layer 2 and the third metallization layer 3 are arranged successively on the front side 19. The metallization layers 1 and 2 are patterned to form conductive lines, in which case from the conductive lines of the first metallization layer 1, only the conductive line 14 is visible in FIG. 7 and only the conductive line 11 is visible in FIG. 8.

FIG. 7 shows a source terminal zone 8 connected to the conductive line 14 of the first metallization layer 1 by means of plated-through holes 42 and also to the conductive lines 22, 24, 26, 28, 30 of the second metallization layer 2 by means of further plated-through holes 52. FIG. 8 reveals that said conductive lines 22, 24, 26, 28, 30 of the second metallization layer 2 are electrically connected to the section 34 of the third metallization layer 3 by means of plated-through holes 62.

FIG. 8 furthermore shows a drain terminal zone 7 connected to the conductive line 11 of the first metallization layer 1 by means of plated-through holes 41 and also to the conductive lines 21, 23, 25, 27, 29, 31 of the second metallization layer 2 by means of further plated-through holes 51. Said conductive lines 21, 23, 25, 27, 29, 31 of the second metallization layer 2 in turn are electrically connected to the section 33 of the third metallization layer 3 by means of plated-through holes 61, which is revealed in FIG. 7.

An intermetal dielectric 4 is provided between the metallization layers 1, 2, 3 in order to increase the dielectric strength and mechanical stability of the semiconductor component.

Only two cell strips are illustrated by way of example in the section of a semiconductor component that is shown in FIGS. 3 to 8. In principle, however, a semiconductor component according to at least one embodiment of the invention may have not just two but any desired number of cell strips which are connected in parallel with one another in the manner described.

Furthermore, a power semiconductor component according to at least one embodiment of the invention may also have besides the first and second metallization layers even further metallization layers which are arranged between the semiconductor body and the third metallization layer and are interconnected with the metallization layers adjacent to them according to the interconnection of the first and second metallization layers. These further metallization layers preferably have the same dimensions and materials as the first and second metallization layers.

Moreover, besides the third metallization layer, one or more further metallization layers may also be provided which are arranged on the semiconductor body and are formed according to the third metallization layer with regard to their configuration, their materials and their electrical linking.

Figure 9:
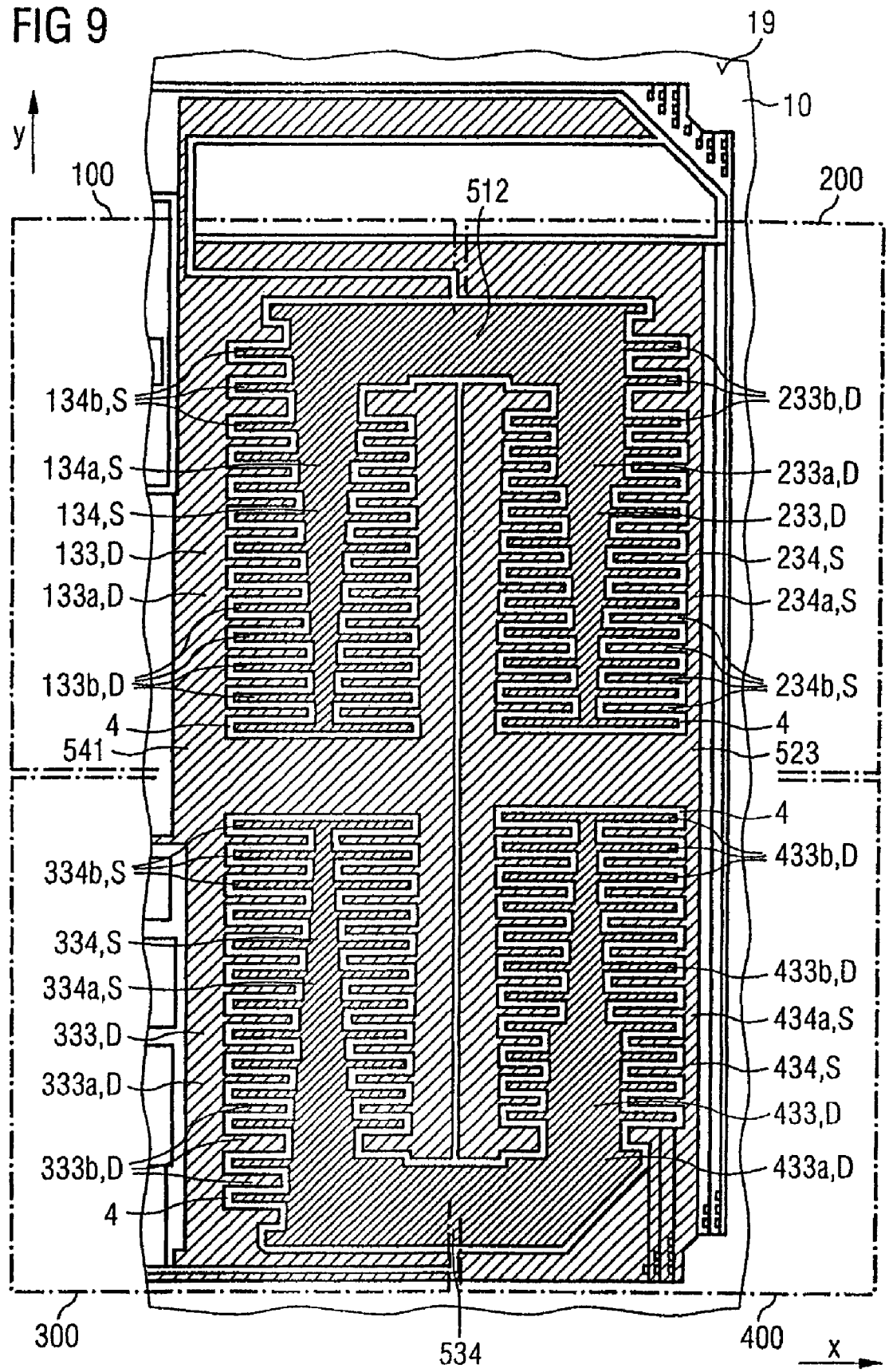
FIG. 9 shows a plan view of a section of a semiconductor component which comprises an H bridge with four DMOS elements.

FIG. 9 shows a plan view of a section of a semiconductor component according to at least one embodiment of the invention comprising an H bridge with four DMOS elements 100, 200, 300 and 400. The DMOS elements 100 and 200 and also the DMOS elements 300 and 400 form a respective half-bridge.

The plan view corresponds to the arrangement in accordance with FIG. 6, the excerpt in FIG. 6 showing a section with only one such DMOS element 100, 200, 300 and 400.

The view shows the third metallization layer 3, in particular. Said third metallization layer 3 comprises, for each of the four DMOS elements 100, 200, 300 and 400, at least one section 134, 234, 334 and 434, respectively, connected to the source terminal zones and also at least one section 133, 233, 333 and 433, respectively, connected to the drain terminal zones.

The sections 133, 134, 233, 234, 333, 334, 433, 434 have extensions 133b, 134b, 233b, 234b, 333b, 334b, 433b and 434b, respectively which are connected to partial sections 133a, 134a, 233a, 234a, 333a, 334a, 433a and 434a, respectively, of the sections 133, 134, 233, 234, 333, 334, 433 and 434, respectively. The partial sections 133a, 134a, 233a, 234a, 333a, 334a, 433a and 434a serve for taking up the current from their respective extensions 133b, 134b, 233b, 234b, 333b, 334b, 433b and 434b, respectively.

The extensions 133b, 134b, 233b, 234b, 333b, 334b, 433b and 434b assigned to the same partial section are arranged parallel to one another, run in the first lateral direction x and intermesh with the extensions 134b, 133b, 234b, 234b, 334b, 333b, 434b and 433b, respectively, of the respective other partial section of the same DMOS element.

Since an H bridge semiconductor component is involved in the present case, two of the partial sections in each case are advantageously electrically conductively connected to one another by means of connecting sections 512, 523, 534, 541.

The partial sections 133a, 134a, 233a, 234a, 333a, 334a, 433a, 434a are formed in elongate fashion and extend in the second lateral direction y.

The width of the partial sections 134a, 233a, 334a and 433a, measured in the first lateral direction x, increases with increasing proximity to the connecting section 512, 523, 534, 541 to which the relevant partial section 134a, 233a, 334a and 433a is connected, in order to be able to take up increasingly more current from the extensions 134b, 233b, 334b and 433b, respectively. In this case, the width of the partial sections 134a, 233a, 334a and 433a may increase in particular monotonically or strictly monotonically with decreasing distance from the respective connecting section 512, 523, 534, 541.

While the invention has been described herein in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LIST OF REFERENCE SYMBOLS
1 First metallization layer
2 Second metallization layer
3 Third metallization layer
4 Intermetal dielectric
7 Terminal zone of the semiconductor body (drain)
8 Terminal zone of the semiconductor body (source)
10 Semiconductor body
19 Front side of the semiconductor body
11-14 Conductive line of the first metallization layer
21-31 Conductive line of the second metallization layer
33 Drain section of the third metallization layer 33b Extension
34 Source section of the third metallization layer
34a Partial section of the source section of the third metallization layer
34b Extension
41 Plated-through hole between the semiconductor body and the first metallization layer (drain potential)
42 Plated-through hole between the semiconductor body and the first metallization layer (source potential)
51 Plated-through hole between the first and second metallization layers (drain potential)
52 Plated-through hole between the first and second metallization layers (source potential)
61 Plated-through hole between the second and third metallization layers (drain potential)
62 Plated-through hole between the second and third metallization layers (source potential)
91, 92 Cell strips
100 First DMOS element
133 Drain section of the first DMOS element of the third metallization layer
133a Partial section of the drain section of the first DMOS element of the third metallization layer
133b Extension of the partial section of the drain section of the first DMOS element of the third metallization layer
134 Source section of the first DMOS element of the third metallization layer
134a Partial section of the source section of the first DMOS element of the third metallization layer
134b Extension of the partial section of the source section of the first DMOS element of the third metallization layer
200 Second DMOS element
233 Drain section of the second DMOS element of the third metallization layer
233a Partial section of the drain section of the second DMOS element of the third metallization layer
233b Extension of the partial section of the drain section of the second DMOS element of the third metallization layer
234 Source section of the second DMOS element of the third metallization layer
234a Partial section of the source section of the second DMOS element of the third metallization layer
234b Extension of the partial section of the source section of the second DMOS element of the third metallization layer
300 Third DMOS element
333 Drain section of the third DMOS element of the third metallization layer
333a Partial section of the drain section of the third DMOS element of the third metallization layer
333b Extension of the partial section of the drain section of the third DMOS element of the third metallization layer
334 Source section of the third DMOS element of the third metallization layer
334a Partial section of the source section of the third DMOS element of the third metallization layer
334b Extension of the partial section of the source section of the third DMOS element of the third metallization layer
400 Fourth DMOS element
433 Drain section of the fourth DMOS element of the third metallization layer
433a Partial section of the drain section of the fourth DMOS element of the third metallization layer
433b Extension of the partial section of the drain section of the fourth DMOS element of the third metallization layer
434 Source section of the fourth DMOS element of the third metallization layer
434a Partial section of the source section of the fourth DMOS element of the third metallization layer
434b Extension of the partial section of the source section of the fourth DMOS element of the third metallization layer
512 Connecting section
523 Connecting section
534 Connecting section
541 Connecting section
b1 Width of the conductive lines of the first metallization layer
b2 Width of the conductive lines of the second metallization layer
d Cell strip width (pitch)
x First lateral direction
y Second lateral direction
z Vertical direction
A Sectional plane
B Sectional plane
D Drain
S Source

What is claimed is:

1. A semiconductor component comprising:

a semiconductor body including a front side and a plurality of cell strips, each cell strip having a terminal zone of a first type arranged on the front side and a terminal zone of a second type arranged on the front side;

a patterned first metallization layer arranged on the front side of the semiconductor body, the first metallization layer including a first plurality of conductive lines;

a patterned second metallization layer succeeding the first metallization layer on the front side of the semiconductor body, the second metallization layer including a second plurality of conductive lines, wherein the second plurality of conductive lines in the second metallization layer cross the first plurality of conductive lines of the first metallization layer at crossover locations, and wherein the second plurality of conductive lines in the second metallization layer are electrically conductively connected at predetermined crossover locations to the first plurality of conductive lines of the first metallization layer; and a patterned third metallization layer succeeding the second metallization layer on the front side of the semiconductor body;

wherein the third metallization layer includes a first section and a second section spaced apart from the first section, the terminal zones of the first type being electrically conductively connected to the first section and the terminal zones of the second type being electrically conductively connected to the second section;

wherein the first section of the third metallization layer includes a first number of elongate extensions running parallel to one another and in a first longitudinal direction, wherein the second section of the third metallization layer has a second number of elongate extensions running parallel to one another in the first longitudinal direction, and wherein the first number of elongate extensions of the first section and the second number of elongate extensions of the second section intermesh;

wherein the second section of the third metallization layer has a second partial section which extends in a second longitudinal direction, and wherein the second number of elongate extensions of the second section of the third metallization layer form an angle greater than 0° and less than or equal to 90° with the second partial section; and wherein the second partial section of the second section of the third metallization layer has a width that is monotonically or strictly monotonically variable with the second longitudinal direction.

2. The semiconductor component of claim 1 wherein a first conductive line of the second metallization layer crosses a first conductive line of the first metallization layer at a first crossover location and a second conductive line of the first metallization layer at a second crossover location, the first conductive line of the first metallization layer and the second conductive line of the first metallization layer being spaced apart from one another.

3. The semiconductor component of claim 2 wherein the first conductive line of the second metallization layer is electrically conductively connected to the first conductive line of the first metallization layer at the first crossover location and to the second conductive line of the first metallization layer at the second crossover location in each case by means of a connecting element arranged between the first metallization layer and the second metallization layer.

4. The semiconductor component of claim 2 wherein the first conductive line of the second metallization layer is electrically conductively connected to the terminal zones of the first type.

5. The semiconductor component of claim 1 wherein a second conductive line of the second metallization layer crosses a third conductive line of the first metallization layer at a third crossover location and a fourth conductive line of the first metallization layer at a fourth crossover location, the third conductive line of the first metallization layer and the fourth conductive line of the first metallization layer being spaced apart from one another.

6. The semiconductor component of claim 5 wherein the second conductive line of the second metallization layer is electrically conductively connected to the third conductive line of the first metallization layer at the third crossover location and to the fourth conductive line of the first metallization layer at the fourth crossover location in each case by means of a connecting element arranged between the first metallization layer and the second metallization layer.

7. The semiconductor component of claim 5 wherein the second conductive line of the second metallization layer is electrically conductively connected to the terminal zones of the second type.

8. The semiconductor component of claim 1 wherein the first plurality of conductive lines of the first metallization layer are oriented parallel to one another at least in sections.

9. The semiconductor component of claim 1 wherein the second plurality of conductive lines of the second metallization layer are oriented parallel to one another.

10. The semiconductor component of claim 1 wherein each of the first plurality of conductive lines of the first metallization layer forms with each of the second plurality of conductive lines of the second metallization layer an angle greater than 0° and less than or equal to 90°.

11. The semiconductor component of claim 1 wherein the first metallization layer and the second metallization layer are spaced apart from one another at least in the region of the active chip area.

12. The semiconductor component of claim 1 wherein the first section of the third metallization layer includes a first partial section extending in a first longitudinal direction, wherein the first number of elongate extensions of the first section of the third metallization layer form an angle greater than 0° and less than or equal to 90° with the first partial section.

13. The semiconductor component of claim 12 wherein the first partial section of the first section of the third metallization layer has a width that is monotonically or strictly monotonically variable with the first longitudinal direction.

14. The semiconductor component of claim 1 wherein each of the first plurality of conductive lines of the first metallization layer and the second plurality of conductive lines of the second metallization layer have a width amounting to greater than or equal to double the width of the cell strips and less than or equal to quadruple the width of the cell strips.

* * * * *